United States Patent
Falk

(10) Patent No.: US 10,027,249 B2
(45) Date of Patent: Jul. 17, 2018

(54) METHOD FOR CONNECTING A PHOTOVOLTAIC INSTALLATION TO A POWER SUPPLY

(71) Applicant: SMA Solar Technology AG, Niestetal (DE)

(72) Inventor: Andreas Falk, Kassel (DE)

(73) Assignee: SMA Solar Technology, Niestetal (DE)

( * ) Notice: Subject to any disclaimer, the term of this patent is extended or adjusted under 35 U.S.C. 154(b) by 1205 days.

(21) Appl. No.: 13/892,587

(22) Filed: May 13, 2013

(65) Prior Publication Data

US 2013/0250641 A1  Sep. 26, 2013

Related U.S. Application Data

(63) Continuation of application No. PCT/EP2011/070171, filed on Nov. 15, 2011.

(30) Foreign Application Priority Data

Nov. 17, 2010  (DE) .................. 10 2010 060 633

(51) Int. Cl.
*H02M 7/537* (2006.01)
*H01L 31/02* (2006.01)
(Continued)

(52) U.S. Cl.
CPC ...... *H02M 7/537* (2013.01); *H01L 31/02021* (2013.01); *H02J 3/383* (2013.01); *H02M 1/36* (2013.01); *Y02E 10/563* (2013.01)

(58) Field of Classification Search
CPC .... H02M 7/537; H02M 1/36; H01L 31/02021
(Continued)

(56) References Cited

U.S. PATENT DOCUMENTS

| 5,378,958 A | 1/1995 | Van Heeswijk |
| 8,169,805 B2 * | 5/2012 | Schill ............... H02M 7/53873 363/131 |

(Continued)

FOREIGN PATENT DOCUMENTS

| EP | 2061143 A2 | 5/2009 |
| EP | 2228893 A2 | 9/2010 |

(Continued)

OTHER PUBLICATIONS

International Search Report for PCT/EP2011/070171 dated Jul. 5, 2012.

*Primary Examiner* — Adolf Berhane
*Assistant Examiner* — Afework Demisse
(74) *Attorney, Agent, or Firm* — Eschweiler & Potashnik, LLC

(57) ABSTRACT

The disclosure relates to a method for connecting a photovoltaic installation to a power supply grid, the photovoltaic installation comprising a photovoltaic generator, a direct voltage intermediate circuit with at least one capacitor, and an inverter. The method including connecting the direct voltage intermediate circuit to the photovoltaic generator and the capacitor is pre-charged to a first voltage. The direct voltage intermediate circuit is then separated from the photovoltaic generator and the capacitor is discharged to or below a second voltage that corresponds to a maximum operating voltage of the inverter. The inverter is then connected to the power supply grid, an inverter bridge of the inverter is clocked, and the direct voltage intermediate circuit is connected to the photovoltaic generator.

18 Claims, 3 Drawing Sheets

(51) Int. Cl.
*H02J 3/38* (2006.01)
*H02M 1/36* (2007.01)

(58) Field of Classification Search
USPC ........ 363/16, 21.02, 40, 71, 95, 97, 98, 131, 363/132, 163; 307/52, 63, 80, 82
See application file for complete search history.

(56) References Cited

U.S. PATENT DOCUMENTS

| | | | |
|---|---|---|---|
| 8,194,375 B2* | 6/2012 | Said El-Barbari | H01L 31/02021 361/91.1 |
| 9,172,312 B2* | 10/2015 | Folts | H02M 7/5387 |
| 9,331,564 B2* | 5/2016 | Lehmann | H02M 1/36 |
| 2009/0302686 A1* | 12/2009 | Fishman | H02M 7/49 307/82 |

FOREIGN PATENT DOCUMENTS

| | | |
|---|---|---|
| EP | 2325984 A1 | 5/2011 |
| JP | S6111830 A | 1/1986 |
| JP | H0720956 A | 1/1995 |
| JP | H0744252 A | 2/1995 |
| JP | 10112989 A | 4/1998 |
| JP | H118976 A | 1/1999 |
| JP | H11312022 A | 11/1999 |
| JP | 2000016782 A | 1/2000 |
| JP | 2001016782 A | 1/2001 |

* cited by examiner

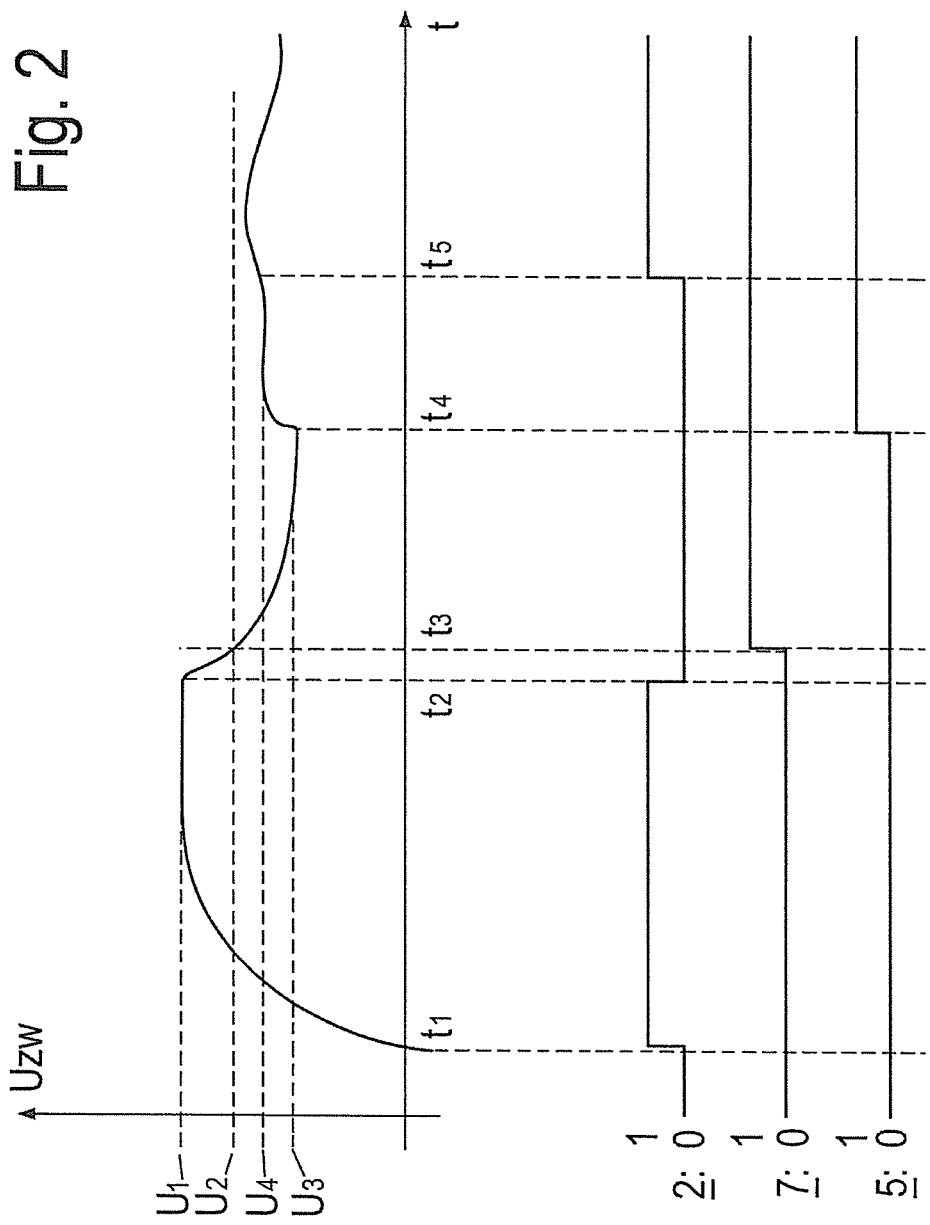

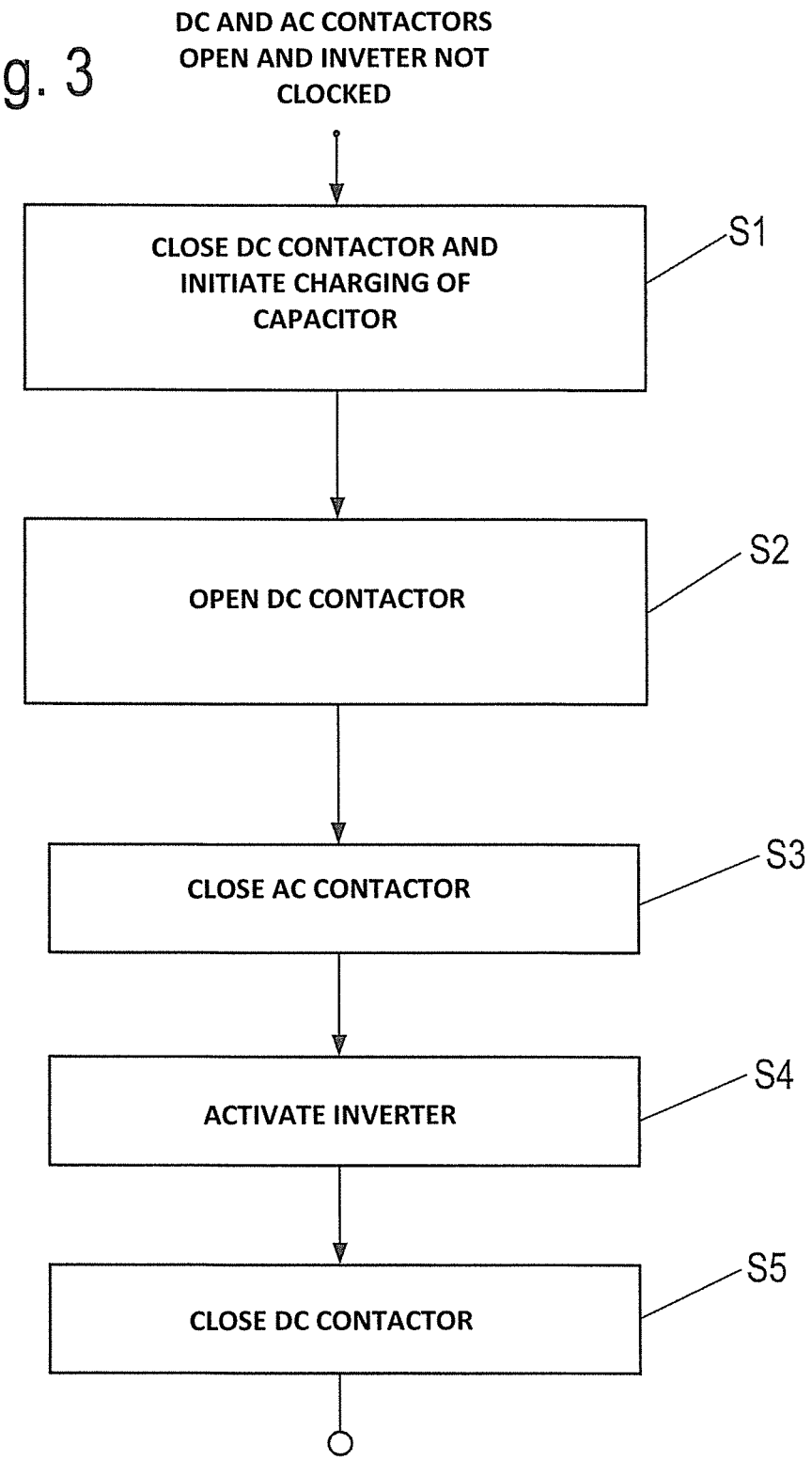

METHOD FOR CONNECTING A PHOTOVOLTAIC INSTALLATION TO A POWER SUPPLY

REFERENCE TO RELATED APPLICATIONS

The application is a continuation application of International Patent Application No. PCT/EP2011/070171, filed on Nov. 15, 2011, which claims priority to German Patent Application No. 10 2010 060 633.2, filed on Nov. 17, 2010, the contents of which are both hereby incorporated by reference in their entirety.

FIELD

The disclosure relates to a method for connecting a photovoltaic installation to a power supply grid, the photovoltaic installation comprising a photovoltaic generator, a direct voltage intermediate circuit with at least one capacitor, and an inverter. The disclosure also relates to a photovoltaic installation which is equipped to carry out the method.

BACKGROUND

Inverters serve to convert a direct current generated by a photovoltaic generator into alternating current which can be fed as single- or multi-phase current into a public or private power supply grid. A photovoltaic generator, hereafter referred to as a PV generator, should be understood in the context of the application as being any arrangement of photovoltaic modules (PV modules), in particular an arrangement in which multiple PV modules are connected in series to form a so-called string. In photovoltaic installations (PV installations) with increasing output, this type of connection becomes more important to minimize ohmic losses in the direct current lines between the PV generator and the inverter.

Inverters have (buffer) capacitors located in their direct current input circuit or in a direct voltage intermediate circuit to smooth the direct voltage despite the pulsed electricity consumption which results during the conversion into alternating current, and to increase the maximum peak current which can be drawn off in a pulse. However, the capacitors prove to be problematic when connecting a PV installation to the power supply grid as in some circumstances unacceptable high charging currents may flow from the power supply grid into the capacitors.

To prevent high charging currents when the PV installation is connected to the power supply grid, the capacitors are charged beforehand to a suitable bias voltage before the PV installation is connected to the power supply grid. As for example known from the document DE 197 35 867 A1, a separate pre-charging device may be provided for this purpose, for example implemented as a connectable pre-charging transformer. However, this entails additional structural complexity.

It is also known to pre-charge the capacitors via the PV generator. PV generators are usually operated by the inverter, with the aid of a tracking system, the so-called MPP (maximum power point) tracker, at a working point at which the maximum electrical power is output. The working voltage at this working point is considerably smaller than the open circuit voltage of the PV generator. For cost reasons, the electric strength of the semiconductor components in an inverter, in particular the power semiconductors in an inverter bridge of the inverter, is usually not designed for frequent or permanent operation with an open circuit voltage. A regular pre-charging of the capacitors in the inverter to the open circuit voltage of the PV generator could thus have a negative effect on the life-time of the semiconductors in the inverter.

It is known from the document JP 113 12 022A to protect the inverter bridge of an inverter by a resistance voltage divider in the direct current input circuit from the high open circuit voltage of a PV generator when the capacitors are pre-charged. During operation, the resistance voltage divider is removed from the connection between the PV generator and the inverter by corresponding switching elements. However, both the resistance voltage divider and the means for bridging it represent greater structural complexity.

It is therefore desirable to provide a method for connecting a PV installation having an inverter to a power supply grid. The method allows the PV installation to be connected with little additional structural complexity and without the inverter being loaded with unacceptably high voltages or currents.

According to one aspect of the disclosure, a method for connecting a photovoltaic installation to a power supply grid is provided. The photovoltaic installation comprises a photovoltaic generator, a direct voltage intermediate circuit with at least one capacitor, and an inverter. The direct voltage intermediate circuit is first connected to the photovoltaic generator and the at least one capacitor is pre-charged to a first voltage. The direct voltage intermediate circuit is then separated from the photovoltaic generator. The at least one capacitor is then discharged to or below a second voltage that corresponds to a maximum operating voltage of the inverter. The inverter is then connected to the power supply grid, an inverter bridge of the inverter is clocked, and the direct voltage intermediate circuit is connected to the photovoltaic generator.

In the above manner, the at least one capacitor in the direct voltage intermediate circuit is first pre-charged via the photovoltaic generator without the inverter being loaded with a high voltage of the photovoltaic generator, for example, its open circuit voltage. When a voltage which does not harm the inverter is reached by discharging the capacitor to or below the second voltage, the inverter is connected to the power supply grid and the inverter bridge of the inverter starts to clock. Neither unacceptably high voltages nor unacceptably high currents occur at the inverter during the pre-charging, which voltages or currents could harm the inverter.

According to an other aspect, an alternative method comprises similar acts with a difference that connecting the inverter to the power supply grid is performed before separating the direct voltage intermediate circuit from the photovoltaic generator. The same advantages as described with the first aspect arise.

In further embodiments of the methods according to the above mentioned aspects, the act in which the direct voltage intermediate circuit is separated from the photovoltaic generator only takes place when the first voltage is greater than a rectifying voltage of the power supply grid. It is thereby prevented that charging currents flow via the inverter into the capacitor of the direct voltage intermediate circuit when the inverter is connected to the power grid. In a further embodiment, the act in which the inverter is connected to the power supply grid takes place when the first voltage is essentially equal to an open circuit voltage of the photovoltaic generator. This way, the criterion mentioned beforehand according to which the first voltage should be greater than the rectifying voltage can easily be fulfilled simply providing an appropriate time during which the direct voltage intermediate circuit is connected to the photovoltaic generator. A voltage that is essentially the same as the open circuit voltage of the photovoltaic generator is e.g. a voltage higher than approximately 90% of the open circuit voltage.

In further embodiments of the methods, a nominal voltage in the direct voltage intermediate circuit is set by clocking the inverter bridge before the direct voltage intermediate circuit is connected to the photovoltaic generator. That way the inverter can be used to control the voltage of the intermediate circuit to an advantageous level, e.g. to a voltage close to an expected working voltage.

In further embodiments of the methods, the at least one capacitor is discharged to or below the second voltage by a resistor connected in parallel to the at least one capacitor. This provides a simple discharging method for the at least one capacitor.

According to another aspect, a photovoltaic installation is provided that has a photovoltaic generator which is connected to an inverter via at least one direct current switching element and a direct voltage intermediate circuit. The direct voltage intermediate circuit here has a capacitor. The inverter can be connected to a power supply grid via an alternating current switching element. The photovoltaic installation comprises a control device for controlling the inverter, the direct current switching element and the alternating current switching element, wherein the control device is configured so as to carry out the above-described method. Again, the same advantages as described above arise.

BRIEF DESCRIPTION OF THE DRAWINGS

The disclosure is explained in detail below with reference to an exemplary embodiment with the aid of three drawings, in which:

FIG. 2 shows an illustration of a voltage curve and of operating states of the method for connecting a PV installation to a power supply grid,
and
FIG. 3 shows a flow diagram of the method illustrated in FIG. 2.

DETAILED DESCRIPTION

Figure 1:
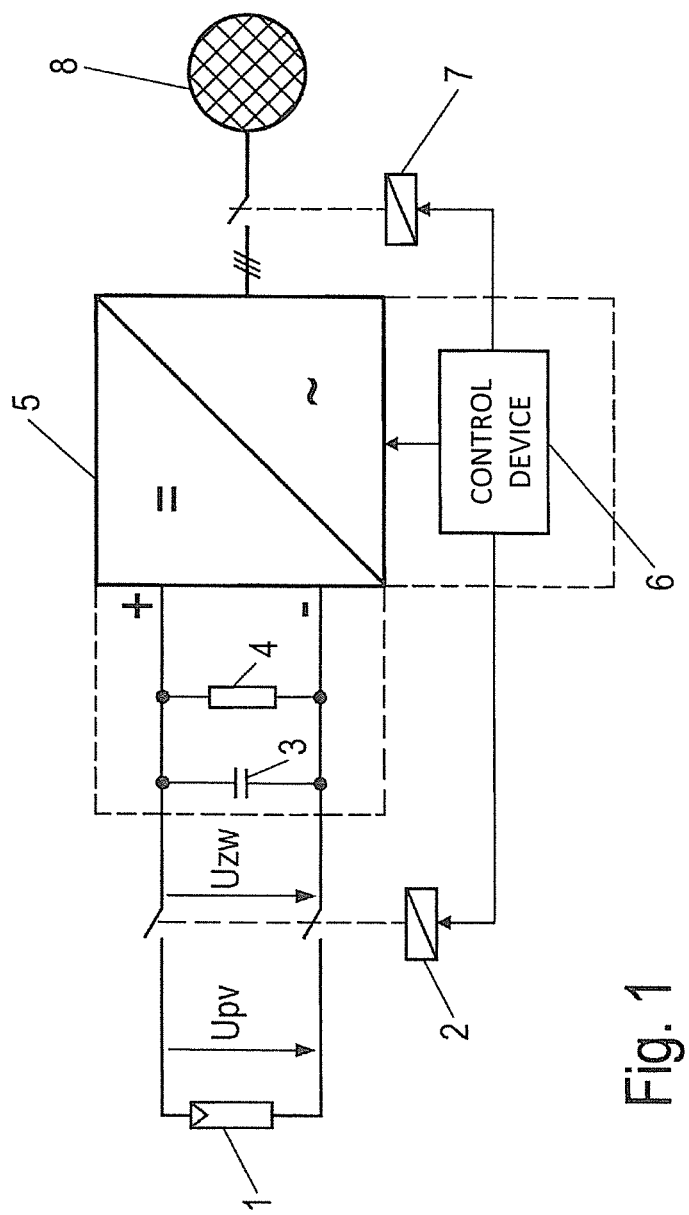
FIG. 1 shows a schematic illustration of a PV installation.

FIG. 1 shows a PV installation in a schematic illustration. The PV installation has a PV generator 1 which provides electrical power in the form of direct current at its outputs with a photovoltaic output voltage Upv, hereafter referred to as PV voltage Upv.

By way of example, the PV generator 1 in FIG. 1 is symbolized by the circuit symbol for a single photovoltaic cell. In one implementation of the illustrated PV installation, the PV generator 1 may be a single PV module which has a plurality of cells, or multiple interconnected PV modules which are in particular connected in series to form a string or to form multiple strings connected in parallel.

The PV generator 1 is connected to an inverter 5 by means of direct current lines via a switching element 2. In the example embodiment in FIG. 1, the switching element 2 is illustrated by a direct voltage contactor. Alternatively, power switches, load disconnecting switches or power semiconductor switches may also be used as the switching element 2. To simplify illustrations and make it easier to differentiate between switching elements on the alternating voltage side, by way of example and with no limitation implied the switching element 2 is referred to below as a DC contactor 2.

It is also conceivable that a PV installation has multiple PV generators, which are then also often referred to as partial generators or sub-generators, which interact with an inverter. In such a case, each of the (partial) generators may be used with its own DC contactor 2. Individual (partial) generators may then be selectively disconnected from the inverter for maintenance purposes or to reduce output. Such a reduction in output may, for example, be requested by an operator of a power supply grid into which the PV installation feeds, because of a temporary surplus of power in the grid. The reduction in output by selectively disconnecting (partial) generators from the inverter may advantageously be combined with a reduction in output by shifting the working point of the inverter. Such a reduction in output by shifting the working point, for example, away from the optimum working point to a working point with a higher voltage, can take place continuously but, in order to protect the power semiconductors of the inverter, only up to a voltage which is below a maximum operating voltage of the inverter. Successive (partial) generators may then be disconnected to achieve a further reduction. Each time there is a disconnection, the working point is moved again towards the optimum working point and then shifted again correspondingly towards a higher voltage for further continuous reduction of power. The combination of both methods for reducing output thus allows the electrical output provided to be adjusted continuously over almost the entire output range.

A capacitor 3 and a resistor 4 are connected in parallel to the inputs of the inverter 5. As symbolized by the rectangle in dashed lines adjoining the inverter on the left in the figure, both the capacitor 3 and the resistor 4 may be integrated into the inverter 5. The resistor 4 may be a separate component and/or an internal resistor inherently present in the input circuit of the inverter 5.

In the example embodiment shown, the capacitor 3 is arranged in the direct current input circuit of the inverter 5. In the case of multi-stage inverters which have a direct voltage converter (DC/DC converter) in addition to an inverter bridge, such a (buffer) capacitor may be provided as an alternative at the output of the DC/DC converter. Whatever the case, in the context of the application the circuit in which the capacitor 3 is arranged is referred to, by way of a generalization, as an intermediate circuit and the direct voltage of the capacitor 3 as an intermediate circuit voltage Uzw. As already explained at the beginning, the capacitor 3 serves to smooth the intermediate circuit voltage Uzw in the case of pulsed power consumption from the intermediate circuit by the inverter 5. Furthermore, only by way of example a single capacitor 3 is shown in the direct current intermediate circuit in FIG. 1. The intermediate circuit could as well comprise two or more capacitors arranged in a parallel and/or in a serial connection.

The inverter 5 is connected to a power supply grid 8 via alternating current outputs and an alternating current switching element 7. The power supply grid 8 may be a public power supply grid or a private power supply grid (island operation). The alternating current switching element 7 is in turn, for example, designed as a contactor and is referred to below, by way of example and with no limitation, as an AC (alternating current) contactor 7.

Moreover, a control device 6 is provided which controls the inverter 5, the DC contactor 2 and the AC contactor 7. As in turn is illustrated by the downward extension of the inverter 5 marked in dashed lines, the control device 6 may also be integrated into the inverter 5.

FIG. 1 shows only those elements of the PV installation which are essential within the scope of the application. On the alternating current side of the inverter 5, unillustrated further switching elements (for example disconnectors), filters (for example, sine filters), grid monitoring devices and/or transformers may, by way of example, be provided. A design of the inverter 5 other than the illustrated three-phase one is also possible, for example a single-phase design. Likewise, on the direct current side or the AC side further elements which are not illustrated here, such as, for example, safety elements may be provided. Sine filters or transformers, may be arranged in the connection between the inverter 5 and the grid 8.

A method for connecting a PV installation to a power supply grid is illustrated below with reference to FIGS. 2 and 3, as by way of example may be carried out by the PV installation shown in FIG. 1. Reference numerals used below relate by way of example to the example embodiment of a PV installation illustrated in FIG. 1.

FIG. 2 shows schematically in its upper part a voltage curve of an intermediate circuit voltage Uzw as a function of time t during which the method is carried out. FIG. 3 illustrates the method in a flow diagram.

In the lower part of FIG. 2, operating states of the DC contactor 2 (top), the AC contactor 7 (middle) and the inverter 5 (bottom) are shown. The same time scale applies for the three operating states as for the illustration of the intermediate circuit voltage Uzw. The operating states each change over the course of the method between values zero and one, wherein, in the case of the DC contactor 2 and the AC contactor 7, zero stands for an open contactor and one for a closed contactor. In the case of the inverter 5, zero stands for a no clocking of an inverter bridge of the inverter 5 and one stands for an operating state in which the inverter bridge of the inverter 5 is clocked i.e. the inverter 5 actively converts direct current into alternating current, or vice versa converts alternating current into direct current.

The starting point of the method is an operating state of the PV installation in which the DC contactor 2 and the AC contactor 7 are opened and the inverter 5 is not clocked.

At S1 of the method (cf FIG. 3), the DC contactor 2 is closed at a first point in time t1 (cf FIG. 2). Assuming that solar radiation falls on the PV generator 1, the electricity provided by the PV generator 1 charges the capacitor 3 in the intermediate circuit, as a result of which the intermediate circuit voltage Uzw increases. The intermediate circuit voltage Uzw reaches a limit value voltage U1 which, assuming that the resistor 4 does not have such low resistance that it represents a significant load on the PV generator, essentially corresponds to the open circuit voltage of the PV generator 1.

At the end of S1, although a relatively high voltage U1 compared with the operating voltage is present at the power semiconductors of the inverter bridge of the inverter 5, it does not load these semiconductors and does not affect their lifetimes as the inverter is not clocked. Consequently, the high voltage does not need to be switched and is split over two semiconductors connected in series which are not clocked.

At S2 of the method, the DC contactor 2 is opened at a second time t2. Consequently, the intermediate circuit voltage Uzw decreases according to a time constant which is generated by the product of the value of the resistance of the resistor 4 and the capacitance of the capacitor 3.

At S3 of the method, the AC contactor 7 is then closed at third time t3. S3 is initiated, in one embodiment, only when the intermediate current voltage Uzw has fallen below a predetermined second voltage U2. This second voltage U2 essentially corresponds to the maximum operating voltage of the inverter 5 and is therefore also referred to below as the maximum voltage U2.

Because free-wheeling diodes are usually arranged in non-parallel fashion to the power semiconductor switches of the inverter bridge, the inverter bridge in the inverter 5 functions as a full wave rectifier for the alternating voltage in the direction of the intermediate circuit. Current flows from the alternating current side to the intermediate circuit only when the intermediate circuit voltage Uzw is smaller than the voltage rectified by the inverter, referred to below as rectifier voltage U3.

The rectifier voltage U3 essentially corresponds to the direct voltage equivalent of the alternating voltage in the power supply grid 8. The height of the direct voltage equivalent of an alternating voltage, also known as effective voltage, being √2 times the height of the alternating voltage.

Assuming that the second voltage U2 is greater than or equal to the rectifier voltage U3, no charging current flows from the alternating voltage side into the capacitor 3. The intermediate circuit voltage Uzw falls again after the point in time t3 and asymptotically approaches the rectifier voltage U3.

At S4, the inverter 5 is activated at a fourth time t4 so that its inverter bridge is clocked. At every time t4 later than the time t3, the intermediate circuit voltage Uzw is below the voltage value U2, i.e. the maximum operating voltage of the inverter 5. S4 may therefore be performed immediately after S3. However, a longer waiting time between S3 and S4 is not harmful as the intermediate circuit voltage Uzw does not fall below the rectifier voltage U3 because of the closed AC contactor 7. The inverter 5 can thus be operated by clocking its inverter bridge at any time after the point in time t3, without stressing its power semiconductors with respect to their electric strength.

The intermediate circuit voltage Uzw is now actively controlled by the inverter 5. In this operating state, the inverter 5 may not only convert DC power into AC power but it may also raise the intermediate circuit voltage Uzw when operating as a boost converter. The intermediate circuit voltage Uzw can therefore be adjusted to a nominal voltage U4 which is above the rectifier voltage U3 but below the maximum voltage U2. The value of the nominal voltage U4 is here chosen such that it approximately corresponds to the (expected) working point of the PV generator 1.

At S5, the DC contactor 2 is closed at time t5 and the PV generator 1 is thus connected to the intermediate circuit. As it is not loaded, the PV generator 1 provides its open circuit voltage before the DC contactor 2 is closed. After the DC contactor 2 has been closed, this higher open circuit voltage first causes an overshoot in the intermediate circuit voltage Uzw, before the latter is reset by the control properties of the inverter 5 to the desired working point for the nominal voltage U4. The control dynamics are here set such that the maximum voltage U2 is not exceeded, even in the event of overshooting.

The intermediate circuit voltage Uzw can then be adjusted by the converter 5 to the optimum working point as part of a tracking process (MPP tracking).

If there are multiple PV generators in the PV installation which can be connected to the inverter 5 via individually switchable switching elements 2 (DC contactors 2), at S5 they can be closed either simultaneously or sequentially to limit the current flowing in the intermediate circuit.

In an alternative to the procedure illustrated in FIGS. 2 and 3, S2 can take place before the intermediate circuit voltage Uzw has reached the limit value of the open circuit voltage at S1 and while it is still rising. However, the intermediate circuit voltage Uzw should already have reached or have exceeded the rectifier voltage U3.

In another alternative to the procedure illustrated in FIGS. 2 and 3, the third step S3 can also take place before S2, and the AC contactor 7 can thus be closed before the DC contactor 2 has opened. Even in this case, S4 should be carried out only when the intermediate circuit voltage Uzw has fallen below the maximum value U2.

The invention claimed is:

1. A method for connecting a photovoltaic installation to a power supply grid, the photovoltaic installation comprising a photovoltaic generator, a direct voltage intermediate circuit with at least one capacitor, and an inverter, comprising:
   connecting the direct voltage intermediate circuit to the photovoltaic generator and the at least one capacitor is pre-charged to a first voltage that is greater than a second voltage that corresponds to a maximum operating voltage of the inverter;
   disconnecting the direct voltage intermediate circuit from the photovoltaic generator after the connecting, wherein the at least one capacitor is discharged to or below the second voltage;
   connecting the inverter to the power supply grid after disconnecting the direct voltage intermediate circuit from the photovoltaic generator;
   clocking an inverter bridge of the inverter after connecting the inverter to the power supply grid; and
   connecting the direct voltage intermediate circuit to the photovoltaic generator after clocking the inverter bridge.

2. The method according to claim 1, wherein the first voltage is greater than a rectifier voltage of the power supply grid.

3. The method according to claim 2, wherein the first voltage and an open circuit voltage of the photovoltaic generator are approximately the same.

4. The method according to claim 1, wherein the inverter is operated to set a nominal voltage in the direct voltage intermediate circuit, before the direct voltage intermediate circuit is connected to the photovoltaic generator.

5. The method according to claim 4, wherein the nominal voltage is above a rectifier voltage, but below the second voltage.

6. The method according to claim 5, wherein the nominal voltage corresponds to a desired working point of the photovoltaic generator.

7. The method according to claim 1, wherein the at least one capacitor is discharged to or below the second voltage by a resistor connected in parallel to the at least one capacitor.

8. A method for connecting a photovoltaic installation to a power supply grid, the photovoltaic installation comprising a photovoltaic generator, a direct voltage intermediate circuit with at least one capacitor, and an inverter, comprising:
   connecting the direct voltage intermediate circuit to the photovoltaic generator and the at least one capacitor is pre-charged to a first voltage;
   connecting the inverter to the power supply grid after connecting the direct voltage intermediate circuit to the photovoltaic generator;
   disconnecting the direct voltage intermediate circuit from the photovoltaic generator after connecting the inverter to the power supply grid, wherein the at least one capacitor is discharged to or below a second voltage that corresponds to a maximum operating voltage of the inverter;
   clocking an inverter bridge of the inverter after separating the direct voltage intermediate circuit from the photovoltaic generator; and
   connecting the direct voltage intermediate circuit to the photovoltaic generator after clocking the inverter bridge.

9. The method according to claim 8, wherein the first voltage is greater than a rectifier voltage of the power supply grid.

10. The method according to claim 9, wherein the first voltage and an open circuit voltage of the photovoltaic generator are approximately the same.

11. The method according to claim 8, wherein the inverter is operated to set a nominal voltage in the direct voltage intermediate circuit, before the direct voltage intermediate circuit is connected to the photovoltaic generator.

12. The method according to claim 11, wherein the nominal voltage is above a rectifier voltage, but below the second voltage.

13. The method according to claim 12, wherein the nominal voltage corresponds to a desired working point of the photovoltaic generator.

14. The method according to claim 8, wherein the at least one capacitor is discharged to or below the second voltage by a resistor connected in parallel to the at least one capacitor.

15. A photovoltaic installation having a photovoltaic generator which is connected to an inverter via at least one direct current switching element and a direct voltage intermediate circuit, wherein the direct voltage intermediate circuit has at least one capacitor and the inverter can be connected to a power supply grid via an alternating current switching element, and a control device is provided for controlling the inverter, the direct current switching element and the alternating current switching element, wherein the control device is to carry out a control method, comprising:
   connecting the direct voltage intermediate circuit to the photovoltaic generator and the at least one capacitor is pre-charged to a first voltage that is greater than a second voltage that corresponds to a maximum operating voltage of the inverter;
   disconnecting the direct voltage intermediate circuit from the photovoltaic generator after the connecting, wherein the at least one capacitor is discharged to or below the second voltage;
   connecting the inverter to the power supply grid after disconnecting the direct voltage intermediate circuit from the photovoltaic generator;
   clocking an inverter bridge of the inverter after connecting the inverter to the power supply grid; and
connecting the direct voltage intermediate circuit to the photovoltaic generator after clocking the inverter bridge.

16. The photovoltaic installation according to claim 15, wherein the direct voltage intermediate circuit is integrated into the inverter.

17. The photovoltaic installation according to claim 15, wherein the control device is integrated into the inverter.

18. A photovoltaic installation having a photovoltaic generator which is connected to an inverter via at least one direct current switching element and a direct voltage intermediate circuit, wherein the direct voltage intermediate circuit has at least one capacitor and the inverter can be connected to a power supply grid via an alternating current switching element, and a control device is provided for controlling the inverter, the direct current switching element and the alternating current switching element, wherein the control device is to carry out a control method, comprising:

connecting the direct voltage intermediate circuit to the photovoltaic generator and the at least one capacitor is pre-charged to a first voltage;

connecting the inverter to the power supply grid after connecting the direct voltage intermediate circuit to the photovoltaic generator;

disconnecting the direct voltage intermediate circuit from the photovoltaic generator after connecting the inverter to the power supply grid, wherein the at least one capacitor is discharged to or below a second voltage that corresponds to a maximum operating voltage of the inverter;

clocking an inverter bridge of the inverter after separating the direct voltage intermediate circuit from the photovoltaic generator; and connecting the direct voltage intermediate circuit to the photovoltaic generator after clocking the inverter bridge.

\* \* \* \* \*